United States Patent
Cheng et al.

(10) Patent No.: US 7,986,022 B2
(45) Date of Patent: Jul. 26, 2011

(54) SEMISPHERICAL INTEGRATED CIRCUIT STRUCTURES

(75) Inventors: Kangguo Cheng, Guilderland, NY (US); Toshiharu Furukawa, Essex Junction, VT (US); Robert R. Robison, Colchester, VT (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 12/621,956

(22) Filed: Nov. 19, 2009

(65) Prior Publication Data
US 2011/0115054 A1    May 19, 2011

(51) Int. Cl.
*H01L 31/105* (2006.01)
(52) U.S. Cl. .................. 257/458; 257/E31.061
(58) Field of Classification Search .......... 257/458–460, 257/463, 464, 486, 586, 587, E31.061; 438/48
See application file for complete search history.

(56) References Cited

U.S. PATENT DOCUMENTS

| | | | |
|---|---|---|---|
| 3,473,067 A | 10/1969 | Rittmayer | |
| 4,165,474 A | 8/1979 | Myers | |
| 5,087,949 A | 2/1992 | Haitz | |
| 5,468,304 A | 11/1995 | Hammerbacher | |
| 5,621,239 A * | 4/1997 | Horie et al. | 257/499 |
| 5,785,768 A | 7/1998 | Nakata | |
| 5,854,123 A | 12/1998 | Sato et al. | |
| 6,177,289 B1 | 1/2001 | Crow et al. | |
| 6,228,727 B1 | 5/2001 | Lim et al. | |
| 6,288,388 B1 * | 9/2001 | Zhang et al. | 250/214.1 |
| 6,451,702 B1 | 9/2002 | Yang et al. | |
| 6,538,299 B1 | 3/2003 | Kwark et al. | |
| 6,620,996 B2 | 9/2003 | Sugawara et al. | |
| 6,667,528 B2 | 12/2003 | Cohen et al. | |
| 6,803,261 B2 * | 10/2004 | Zhang et al. | 438/144 |
| 6,812,059 B2 * | 11/2004 | Kang et al. | 438/57 |
| 6,825,087 B1 | 11/2004 | Sharp et al. | |
| 7,709,914 B2 * | 5/2010 | Lee | 257/432 |
| 2002/0158252 A1 * | 10/2002 | Zhang et al. | 257/72 |
| 2003/0230788 A1 * | 12/2003 | Fujii | 257/565 |
| 2004/0007753 A1 * | 1/2004 | Seki et al. | 257/443 |
| 2005/0224828 A1 * | 10/2005 | Oon et al. | 257/99 |
| 2007/0040233 A1 * | 2/2007 | Kariya | 257/458 |

FOREIGN PATENT DOCUMENTS
JP         5235399         9/1993
* cited by examiner

*Primary Examiner* — Nathan W Ha
(74) *Attorney, Agent, or Firm* — Gibb I.P. Law Firm, LLC; Anthony J. Canale (57) ABSTRACT

A diode comprises a substrate formed of a first material having a first doping polarity. The substrate has a planar surface and at least one semispherical structure extending from the planar surface. The semispherical structure is formed of the first material. A layer of second material is over the semispherical structure. The second material comprises a second doping polarity opposite the first doping polarity. The layer of second material conforms to the shape of the semispherical structure. A first electrical contact is connected to the substrate, and a second electrical contact is connected to the layer of second material. Additional semiconductor structures are formed by fabricating additional layers over the original layers.

24 Claims, 12 Drawing Sheets

SEMISPHERICAL INTEGRATED CIRCUIT STRUCTURES

BACKGROUND

The present embodiments herein relate to transistor structures such as diodes and bipolar transistors, and more specifically, to diodes and bipolar transistors that utilize semispherical structures.

PN (P-type region/N-type region) junction diodes and PIN (P-type region-intrinsic-N-type region) diodes are commonly used in a wide variety of products such as Radio Frequency (RF) switching devices, telecommunication products, electrostatic discharge (ESD) protect devices, imaging sensors, and the like. The application of PIN diodes may also be extended to photodetectors or optical receivers for emerging optical interconnect technology. For example, when light is illuminated on a PIN photodiode, a current may be generated in the PIN photodiode based on the intensity of the light. When no light is present, the PIN photodiode may be reverse biased, and almost no current may be generated in the PIN photodiode. Therefore, PIN photodiodes are capable of detecting optical signals. Another application of PN and PIN diodes are space applications where it is highly desired to detect cosmic radiation.

A conventional PN diode is typically formed on a planar surface of a semiconductor substrate by, for example, forming an N-type layer on a P-type substrate, or a P-type layer on an N-substrate. An additional lightly doped layer or an intrinsic layer is formed between the N and P layer in the case of forming a PIN diode. However, the conventional planar PN or PIN diodes have several disadvantages. In recent years, the need to remain cost and performance competitive in the production of semiconductor devices has resulted in increasing device density in integrated circuits. To facilitate the increase in device density, the feature size of semiconductor devices continues to be reduced. In the case of the planar PN and PIN diodes, reducing feature size results in a limited junction area between the p, i, and n layers, thereby reducing the sensitivity of the PIN diode to light, for example. Another disadvantage of laterally formed PN and PIN diodes is that those diodes are sensitive to the direction of incoming light. For example, the sensitivity of laterally formed PN and PIN diode is impacted by the direction of the incoming light beam. A planar diode may have different sensitivity on lights with same density but different incoming directions.

One solution to achieve reduced feature size without sacrificing PIN diode sensitivity is forming vertical PIN diodes in deep trenches. While forming PIN diodes in deep trenches enhances junction area, and therefore diode sensitivity, the process for forming the PIN diodes is relatively complicated and costly.

Further bipolar junction transistors (BJT's) are ubiquitous in high-speed and/or high-current driver applications. Current drive in standard planar BJT's is limited by the surface area of the emitter, and the capacitive loading that is present in the alternative structure of emitter-down (or buried)/collector-up (as top layer).

SUMMARY

One embodiment of the present embodiments herein is a diode comprising a substrate formed of a first material having a first doping polarity. The substrate has a planar surface and at least one semispherical structure extending from the planar surface, where "semispherical" includes a curved, nonplanar surface that is some fraction of a sphere that could be, but is not limited to, 50 percent (such as a half-sphere). The semispherical structure is formed of the first material.

A layer of second material is over the semispherical structure. The second material comprises a second doping polarity opposite the first doping polarity. The layer of second material conforms to the shape of the semispherical structure. A first electrical contact is connected to the substrate, and a second electrical contact is connected to the layer of second material.

Another embodiment herein is a bipolar transistor comprising a substrate formed of a first material that has a first doping polarity. The substrate has a planar surface. At least one semispherical structure extends from the planar surface. The semispherical structure comprises a second material that has a second doping polarity opposite the first doping polarity.

A layer of second material is over the semispherical structure. The second material has the first doping polarity. The layer of second material conforms to the shape of the semispherical structure. A layer of third material is over layer of second material. The third material has the second doping polarity. The layer third material conforms to the shape of the semispherical structure. A collector contact is connected to the semispherical structure, a base contact is connected to the layer of second material, and an emitter contact is connected to the layer of third material. In another optional embodiment the design and function of the emitter and collector regions can be swapped.

A further embodiment herein comprises a method of forming a diode. The method provides a substrate comprising a first material having a first doping polarity. The substrate has a planar surface. The method patterns at least one semispherical structure extending from the planar surface. The semispherical structure is formed of the first material. The method forms a layer of second material over the semispherical structure. The second material has a second doping polarity opposite the first doping polarity. The layer of second material conforms to the shape of the semispherical structure. The method forms a first electrical contact connected to the substrate and forms a second electrical contact connected to the layer of second material.

An additional embodiment herein is a method of forming a bipolar transistor. The method provides a substrate comprising a first material that has a first doping polarity. The substrate has a planar surface. The method patterns at least one semispherical structure extending from the planar surface. The semispherical structure comprises a second material that has a second doping polarity opposite the first doping polarity.

The method forms a layer of second material over the semispherical structure. The second material has the first doping polarity. The layer of second material conforms to the shape of the semispherical structure. The method forms a layer of third material over the layer of second material. The third material has the second doping polarity. The layer third material conforms to the shape of the semispherical structure. The method forms a collector contact connected to the semispherical structure, forms a base contact connected to the layer of second material, and forms an emitter contact connected to the layer of third material.

DETAILED DESCRIPTION

The embodiments herein provide a method and structure for forming semispherical integrated circuit structures such as PN diodes, PIN diodes, bipolar transistors, etc., where "semispherical" includes a curved, nonplanar surface that is some fraction of a sphere that could be, but is not limited to, 50 percent (such as a half-sphere). Compared to conventional planar structures, the inventive structures have several advantages. First, the semispherical structures have enhanced surface area when compared to planar structures. Therefore, the inventive structures have enhanced sensitivity. Second, the semispherical structure reduces the dependence on the direction of incoming light beam.

The inventive diodes can be very useful in many applications. For example, they can be used as radiation detectors in space applications. They can be integrated with complimentary metal oxide semiconductor (CMOS) to form CMOS imaging sensors. They can be used as photodetectors in optical interconnections. They can further be used as an on-chip thermal sensor to monitor and prevent thermal run-away of a chip.

Referring now to FIGS. 1-4, one embodiment herein comprises a method of forming a diode. The method provides a substrate comprising a first material 100 having a first doping polarity. For example, the first material 100 can comprise any material appropriate for the given purpose (whether now known or developed in the future) and can comprise, for example, semiconductor materials including, SiC, SiGe, SiGeC, Ge alloys, GaAs, InAs, TnP, other III-V or II-VI compound semiconductors, or organic semiconductor structures, etc.

Figure 1:
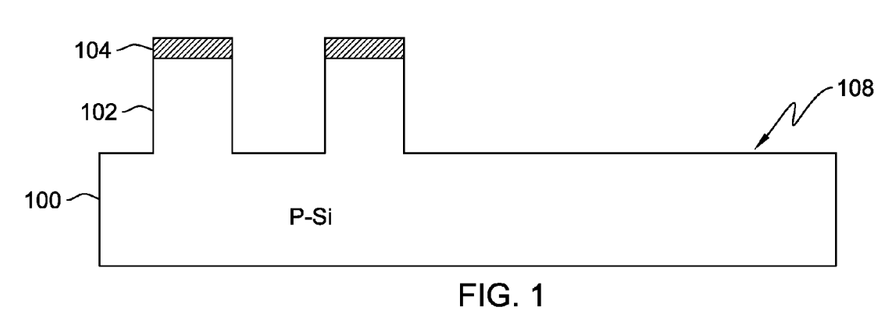
FIG. 1 is a cross-sectional schematic diagram of an integrated circuit diode structure according to embodiments herein.

The substrate 100 can be doped with a positive-type (P-type impurity, e.g., boron, indium, etc.) or a negative-type (N-type, e.g., phosphorus (P), arsenic (As), antimony (Sb) etc.) impurity. In the example shown in FIG. 1, the substrate is doped with a P-type impurity. As also shown in FIG. 1, the substrate 100 has a planar surface 108.

The method patterns at least one semispherical structure extending from the planar surface. It does this as shown in FIG. 1, by patterning structures 102 on the planar surface 108 of the substrate 100. The structures are created by depositing a layer of material 102 and then patterning a mask layer 104. The mask layer 104 can comprise any form of commonly available masking material, such as an organic photoresist. As is well known to those ordinarily skilled in the art, such masks are generally exposed to a light source (which changes their reaction to a developer) and rinsed with a developer to form a protective pattern.

The material 102 not protected by the mask layer 104 is then removed in a selective removal process that can comprise, for example, reactive ion etching (RIE). The structures 102 can comprise any appropriate shape, such as cubes, squares, fins, cylinders, cones, tubes, etc.

Figure 2:
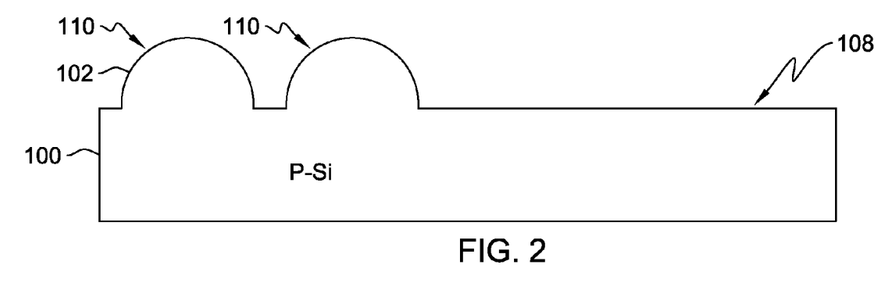
FIG. 2 is a cross-sectional schematic diagram of an integrated circuit diode structure according to embodiments herein.

The mask layer 104 is removed and a silicon reflow process is performed to transform the structures 102 into semispherical silicon bumps 110, as shown in FIG. 2. Thus, at this point, items 100 and 102 can be considered to be the same material. One exemplary silicon reflow process comprises a hydrogen anneal process at a temperature ranging from 900° C. -1100° C. for 20 seconds 100 seconds. The structure at this point can be formed of an in-situ doped material or a doping implantation can occur at this point, using any of the doping schemes discussed herein.

Figure 3:
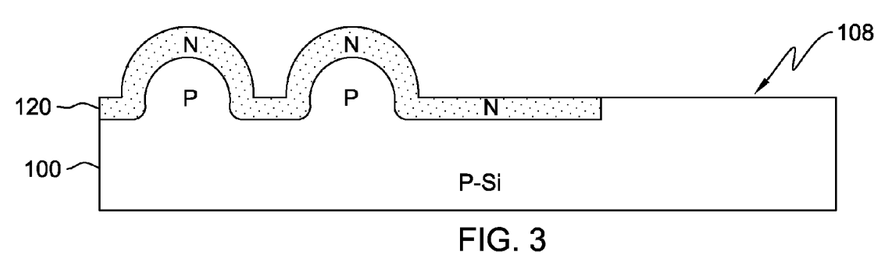
FIG. 3 is a cross-sectional schematic diagram of an integrated circuit diode structure according to embodiments herein.

As shown in FIG. 3, an N-type layer 120 is formed atop the semispherical silicon bumps 110 by ion implantation or in-situ doped epitaxial growth. Ion implantation is a well-known manufacturing technique that involves bombarding a material with impurity ions. The power level of ion bombardment and the elapsed time control the depth and amount of impurity implanted into the material. Doped epitaxial growth is another well-known manufacturing technique whereby items are placed within a processing chamber that is rich in one or more impurities. A selection of pressure (or vacuum) temperature, etc. is utilized to epitaxially grow doped material upon the structure within the chamber. A block mask may be used to prevent N-type layer formation in the area where N-type layer is not needed. Alternatively, a blanket ion implantation or epitaxial growth can be performed to form N-type layer everywhere, and then use a block mask in combination with a material removal process can be performed to remove the N-type layer from areas where it is not needed.

Thus, as shown in FIGS. 1-3, at least one semispherical structure 110 is formed of the first material 100. The method also forms a layer of second material 120 over the semispherical structure 110. Many different types of diodes can be formed using the embodiments herein and while this embodiment illustrates a P-type substrate within an overlying N-type layer, 120, the doping profiles can be switched so long as the second material 120 has a second doping polarity that is opposite the first doping polarity 100. The layer of second material 120 conforms to the shape of the semispherical structure 110.

Figure 4:
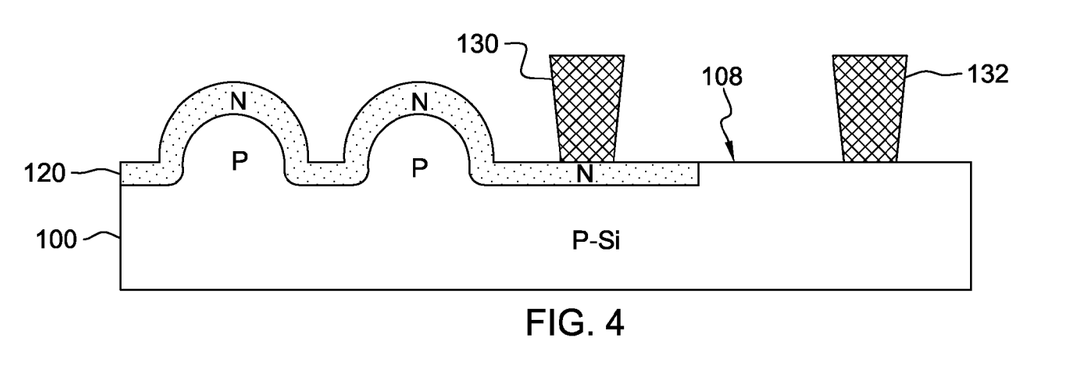
FIG. 4 is a cross-sectional schematic diagram of an integrated circuit diode structure according to embodiments herein.

As shown in FIG. 4, the method forms a first electrical contact 132 connected to the substrate 100 and forms a second electrical contact 130 connected to the layer of second material 120. Optionally the structure and method can place the second electrical contact directly on top of the structure without the planar extension of 120, thus saving space.

The process shown in FIGS. 1-4 produces a diode comprising a substrate 100 formed of a first material 100 having a first doping polarity. The substrate 100 has a planar surface and at least one semispherical structure 110 extending from the planar surface. The semispherical structure 110 is formed of the first material 100, 102. A layer of second material 120 is over the semispherical structure 110. The second material 120 comprises a second doping polarity opposite the first doping polarity.

A first electrical contact 132 is connected to the substrate 100, and a second electrical contact 130 is connected to the layer of second material 120. The contacts described herein can comprise any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

The layer of second material 120 conforms to the shape of the semispherical structure 110. Further, as shown in FIG. 4, a portion of the layer of the second material 120 is positioned within the substrate 100 and has an upper surface co-planar with the planar surface 108. The second material 120 can be a deposited layer or an implanted layer.

Figure 5:
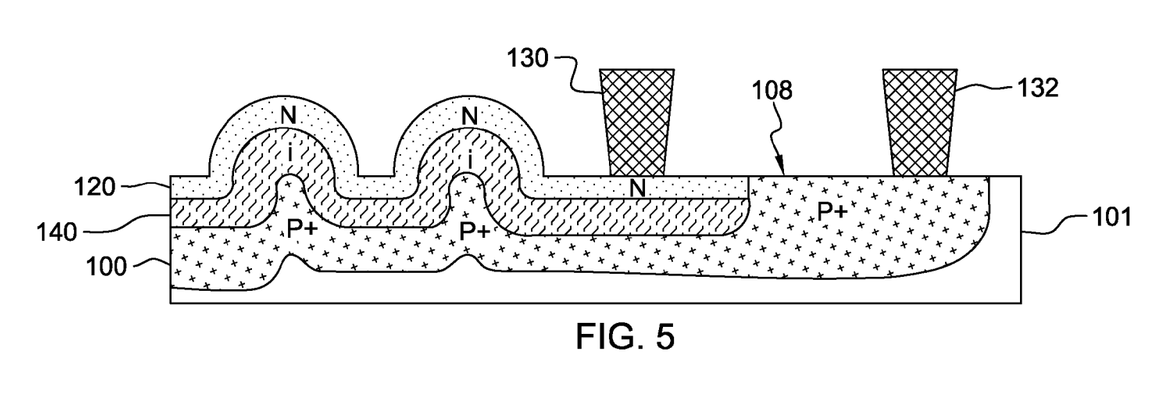
FIG. 5 is a cross-sectional schematic diagram of an integrated circuit diode structure according to embodiments herein.

As shown in FIG. 5, the method can also form an intrinsic layer 140 before forming the layer of second material 120. The intrinsic layer 140 is positioned between the first material 100 and the layer of second material 120. The intrinsic layer 140 conforms to the shape of the semispherical structure 110. The processing shown in FIGS. 1-4 can be utilized to form the structure shown in FIG. 5 by forming the intrinsic layer 140 before forming the layer of second material 120.

More specifically, in FIG. 5 the substrate 101 comprises an intrinsic material (a semiconductor that is lightly doped or is essentially free of impurities). The semispherical structures 110 are formed in the substrate 101 as shown above. Then a P-type material 100 is implanted at a depth within this substrate 101 to allow some intrinsic material 140 to remain above the P-type material 100. Similarly, the N-type material 120 is implanted at a depth that allows the intrinsic material 140 to remain below the N-type material 120. Thus, the process of forming of the intrinsic layer 140 implants impurities 100, 120 into the substrate 101 in a manner that leaves an undoped region 140 of the intrinsic substrate 101 between the first material 100 and the second material 120.

While the previous embodiment utilizes epitaxial growth or ion implantation to form the diode, the structure can also be formed by depositing or growing additional layers as illustrated in FIGS. 6-9. More specifically, in FIG. 6 the structures shown in FIG. 2 is created and an optional dielectric layer 150 is deposited thereon.

The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Figure 6:
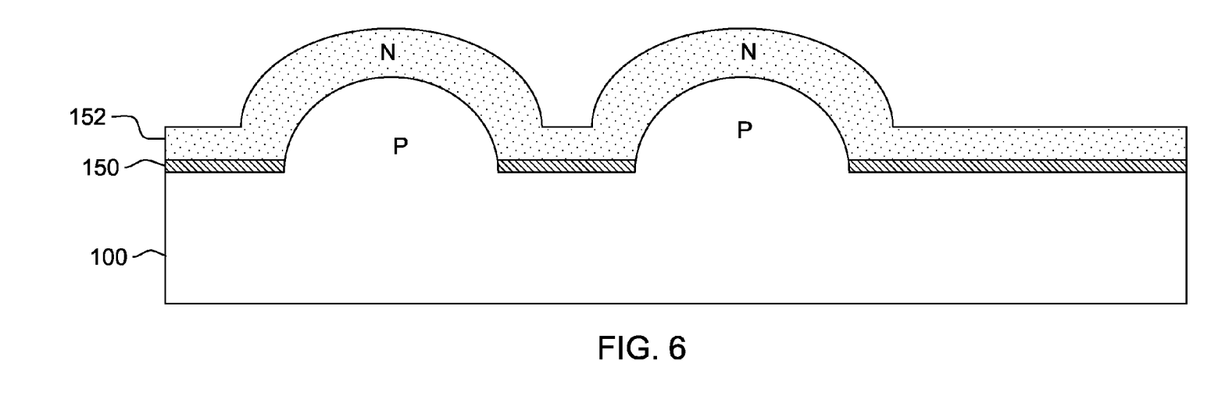
FIG. 6 is a cross-sectional schematic diagram of an integrated circuit diode structure according to embodiments herein.
Figure 7:
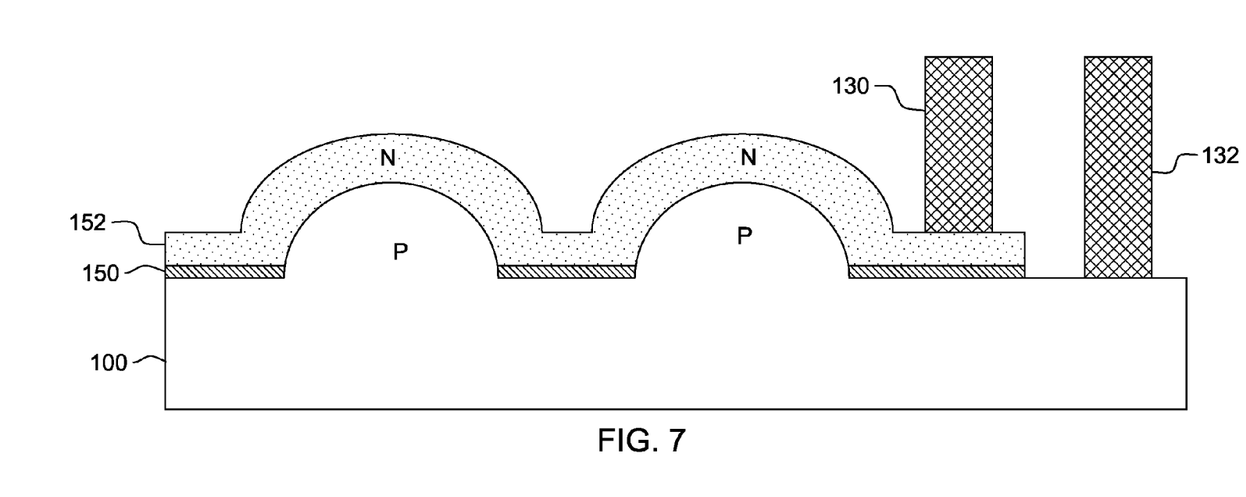
FIG. 7 is a cross-sectional schematic diagram of an integrated circuit diode structure according to embodiments herein.

Also, in FIG. 6, a layer of the second material 152 (that is already doped; in-situ doped) is deposited. This process can be followed by an optional annealing (heating) process. Then, as shown in FIG. 7, the contacts 130, 132 are formed. With the structure shown in FIG. 7, a portion of the layer of the second material 120 is positioned directly on the planar surface of the substrate 100.

Figure 8:
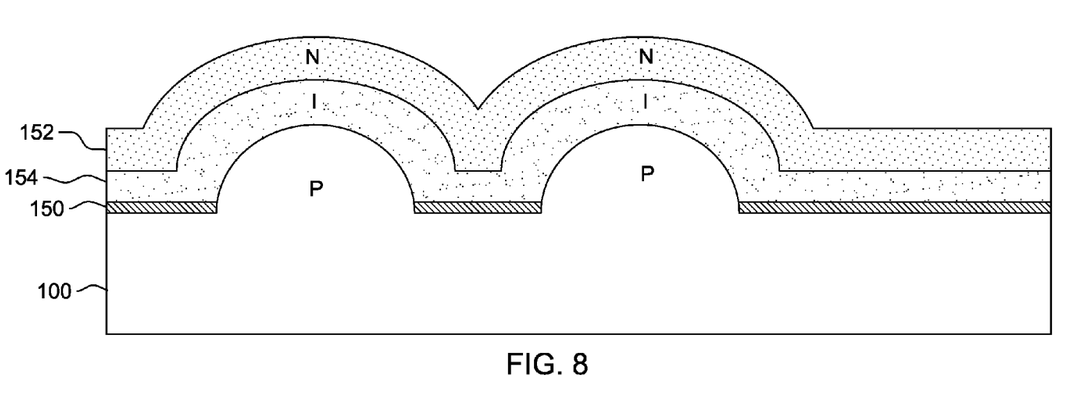
FIG. 8 is a cross-sectional schematic diagram of an integrated circuit diode structure according to embodiments herein.
Figure 9:
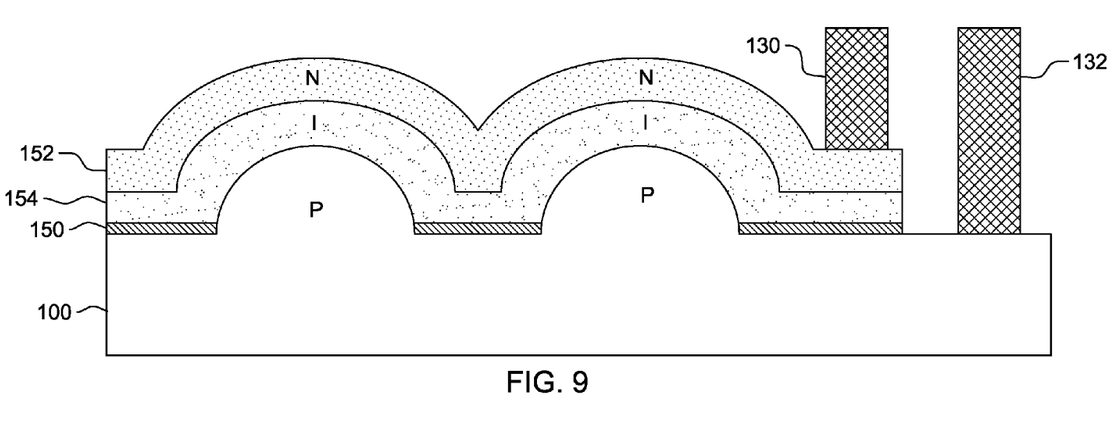
FIG. 9 is a cross-sectional schematic diagram of an integrated circuit diode structure according to embodiments herein.

The structures shown in FIGS. 8 and 9 are similar to that shown in FIGS. 6 and 7 except that in FIGS. 8 and 9, the intrinsic layer 154 is included. However, rather than being formed by ion implantation as was done above, the intrinsic layer 154 here is formed by deposition of an intrinsic material before deposition of the second material 152. With the structure shown in FIG. 9, a first portion of the intrinsic layer 154 is positioned directly on the planar surface of the substrate 100, and a first portion of the layer of second material 120 is positioned directly on the first portion of the intrinsic layer 140.

Therefore, as shown above, diodes with semispherical structures can be formed herein through ion implantation (FIG. 4) or by deposition (FIG. 7) and can be formed with or without intrinsic layers (FIGS. 5 and 9).

In addition, this disclosure improves on the conventional structures by using a semispherical structure to form the emitter, base, and collector regions of a bipolar transistor, as shown in FIGS. 10-23. As shown below, the emitter-base regions are formed on the top layers, thus creating a low resistance, high current base-emitter junction. The semispherical structure of the base region creates electrical field enhancement in the base region in the direction of current for additional performance. Optionally field-enhanced transport can be created by forming the base region from SiGe.

Figure 10:
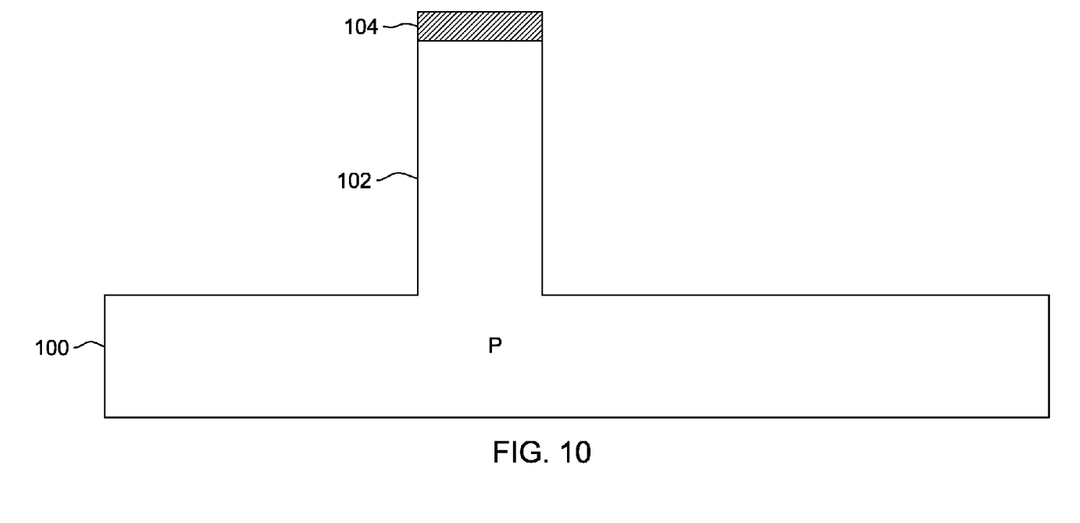
FIG. 10 is a cross-sectional schematic diagram of an integrated circuit bipolar transistor structure according to embodiments herein.
Figure 11:
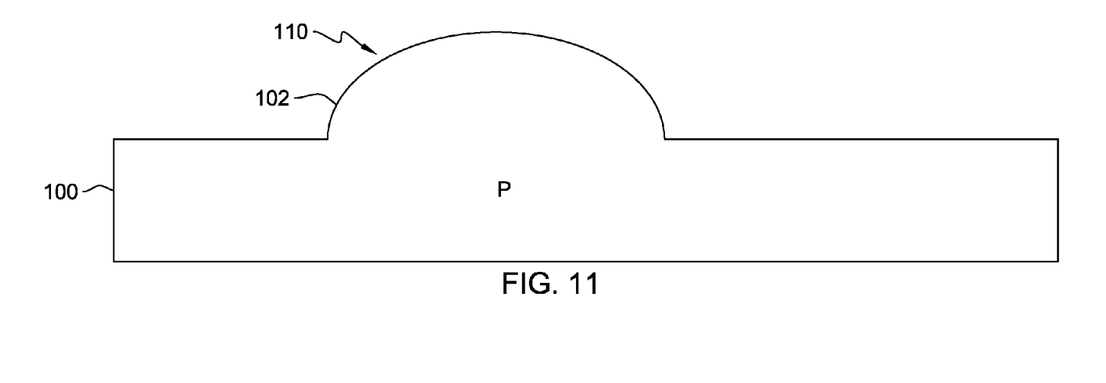
FIG. 11 is a cross-sectional schematic diagram of an integrated circuit bipolar transistor structure according to embodiments herein.

FIGS. 10-23 illustrate a method of forming a bipolar transistor. As shown in FIGS. 10-11, the method similarly provides a substrate 100 comprising a first material 100 that has a first doping polarity. The substrate 100 again has a planar surface. The method patterns at least one semispherical structure 110 extending from the planar surface using the processing discussed above, as shown in FIG. 11.

Figure 12:
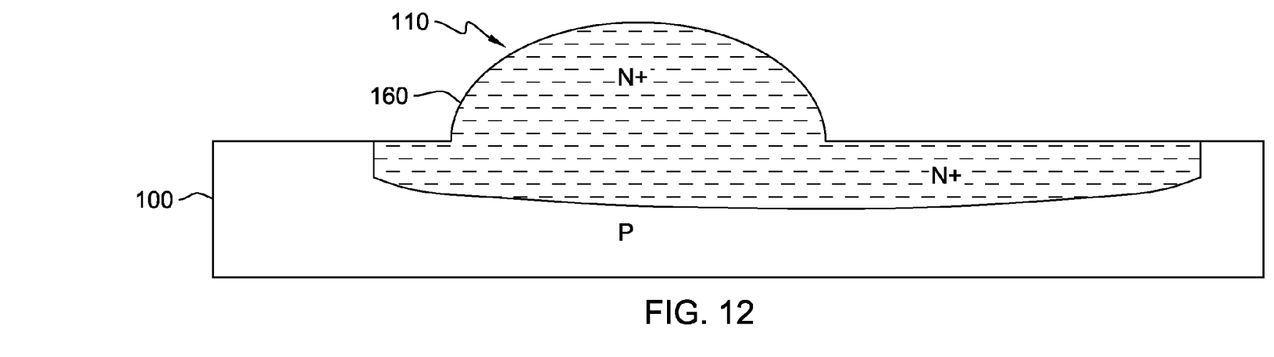
FIG. 12 is a cross-sectional schematic diagram of an integrated circuit bipolar transistor structure according to embodiments herein.
Figure 13:
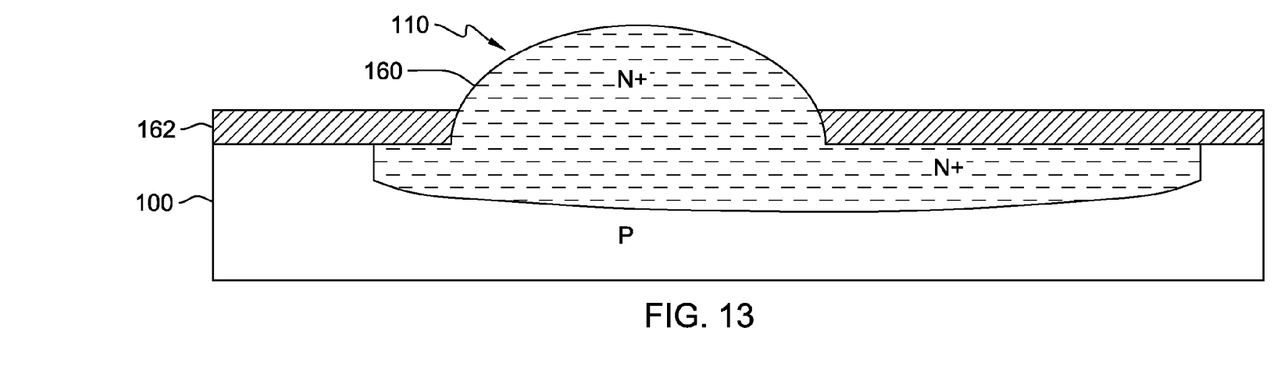
FIG. 13 is a cross-sectional schematic diagram of an integrated circuit bipolar transistor structure according to embodiments herein.
Figure 14:
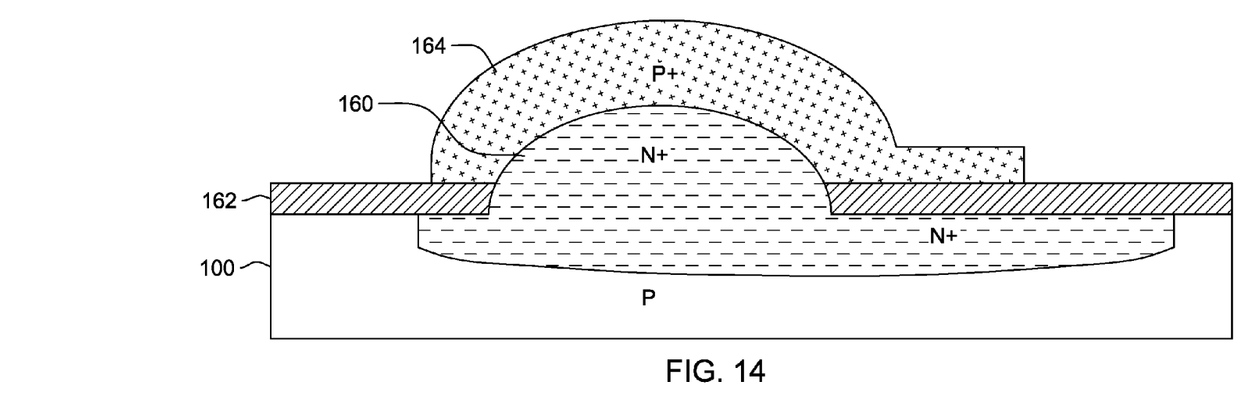
FIG. 14 is a cross-sectional schematic diagram of an integrated circuit bipolar transistor structure according to embodiments herein.

Then, as shown in FIG. 12, an ion implantation process is performed to dope the semispherical structure 110 with an opposite type impurity (the second impurity) relative to the doping polarity of the substrate 100. Thus, this process forms a rounded bump (a semispherical structure) on the substrate 100 and implants the second doping polarity ions into the semispherical structure 160 and into a portion of the substrate 100 adjacent the semispherical structure 160. Thus, in this embodiment the semispherical structure 110 comprises a second material 160 that has a second doping polarity opposite the first doping polarity of the substrate 100. As shown in FIG. 13, another dielectric 162 can be grown or deposited over the structure. The insulating layer 162 is positioned only in regions where the semispherical structure 160 is absent.

Figure 15:
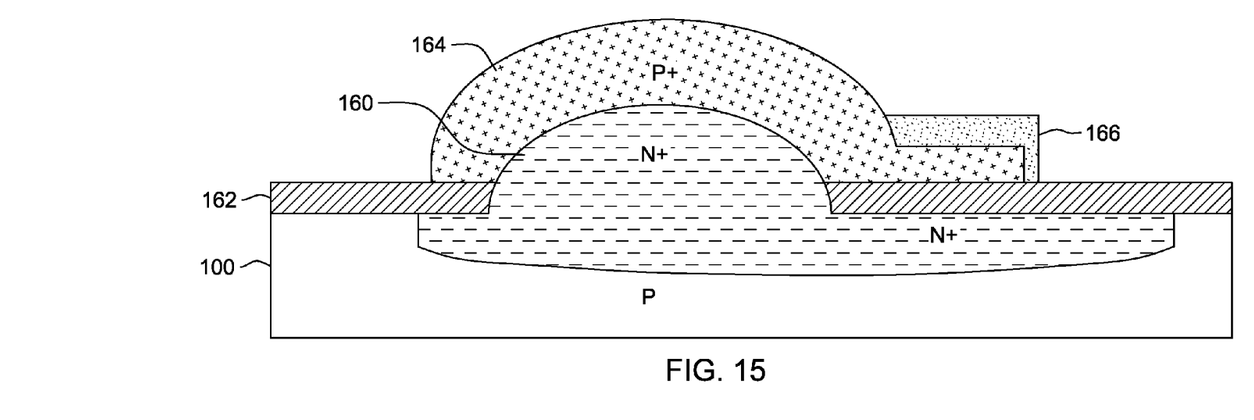
FIG. 15 is a cross-sectional schematic diagram of an integrated circuit bipolar transistor structure according to embodiments herein.

The method then forms a layer of second material 164 over the semispherical structure 160. The second material 164 has the first doping polarity of the substrate 100, although the concentration of doping can be higher in the second material 164 than it is in the substrate 100. The layer of second material 164 conforms to the shape of the semispherical structure 160. In FIG. 15, the method patterns a conductive contact 166 that is connected to the second material 164 using any of the materials or processing discussed above.

Figure 16:
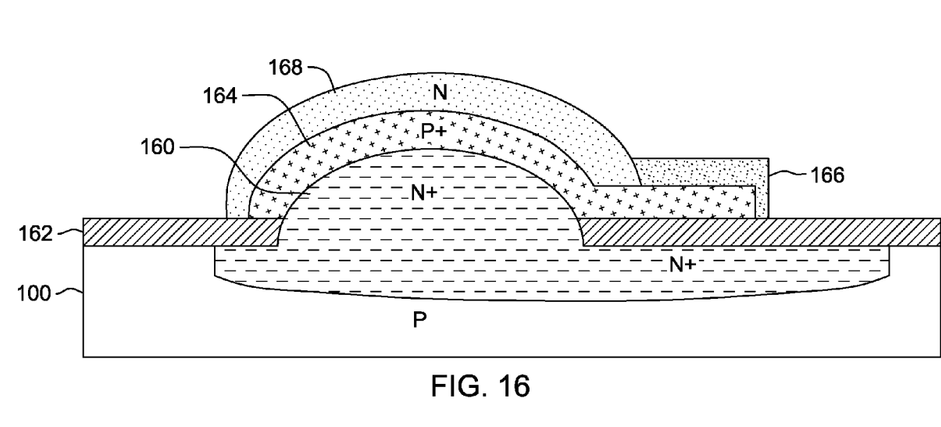
FIG. 16 is a cross-sectional schematic diagram of an integrated circuit bipolar transistor structure according to embodiments herein.

In FIG. 16, the method forms a layer of third material 168 over the layer of second material 164. The third material 168 has the second doping polarity, although the concentration of the second doping material can be less in the third material layer 168 when compared to the doping concentration within the semispherical structure 160. The layer of third material 168 conforms to the shape of the semispherical structure 160.

Figure 17:
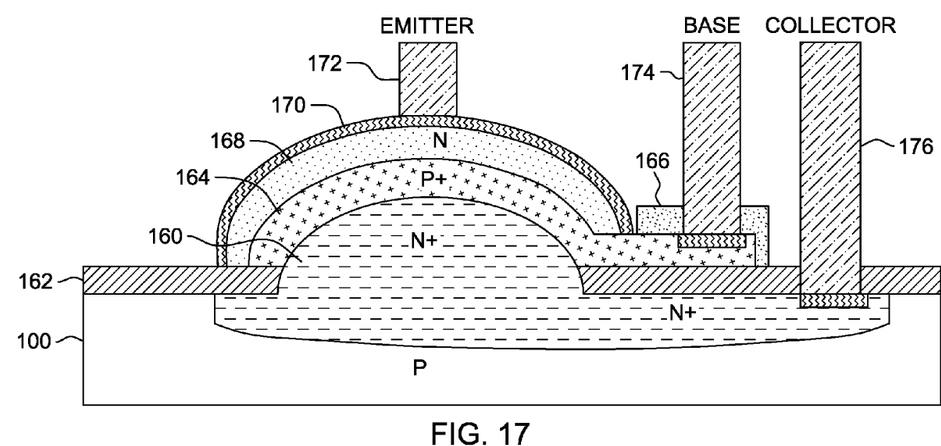
FIG. 17 is a cross-sectional schematic diagram of an integrated circuit bipolar transistor structure according to embodiments herein.
Figure 18:
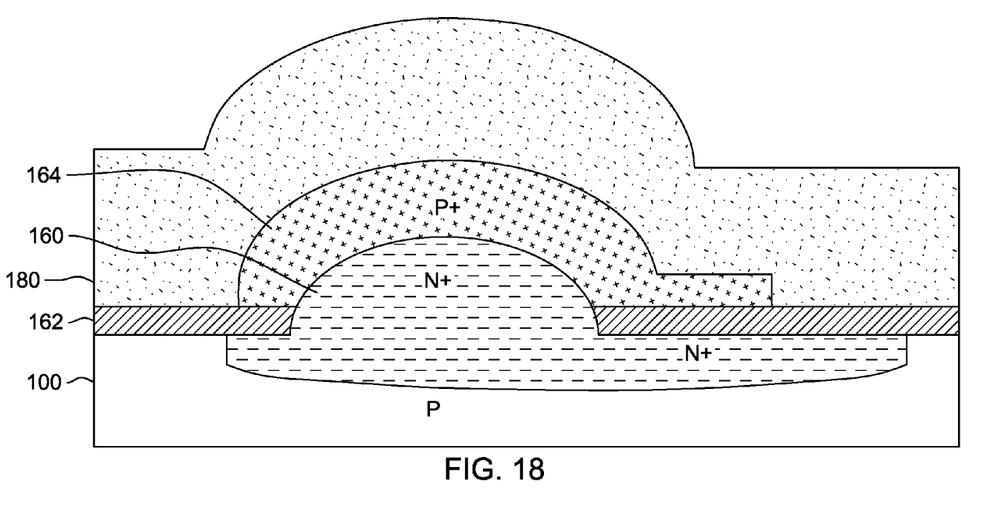
FIG. 18 is a cross-sectional schematic diagram of an integrated circuit bipolar transistor structure according to embodiments herein.

In FIG. 17, a silicide layer 170 is deposited or grown and the various conductive contacts are formed. More specifically, the method here forms a collector contact 176 connected to the semispherical structure 160, a base contact 174 connected to the layer of second material 164, and an emitter contact 172 connected to the layer of third material 168. The collector contact 176 is formed to extend through the insulating layer 162.

As shown in FIG. 17, the semispherical structure 160, the layer of second material 164, and the layer of third material 168 form an approximately half-sphere bump on the planar surface of the substrate 100. Further, the forming of the layer of second material 164 causes the layer of second material 164 to directly contact the semispherical structure 160, and the forming of the layer of third material 168 causes the layer of third material 168 to directly contact the layer of second material 164 over the region of the semispherical structure 160.

This produces the bipolar transistor shown in FIG. 17 that comprises a substrate 100 formed of a first material 100 that has a first doping polarity. As shown above, the substrate 100 has a planar surface. At least one semispherical structure 160 extends from the planar surface. The semispherical structure 160 comprises a second material 164 that has a second doping polarity opposite the first doping polarity. For example, one could be a P-type doped material and the other could be an N-type doped material.

The layer of second material 164 is over the semispherical structure 160. The second material 164 has the first doping polarity. The layer of second material 164 conforms to the shape of the semispherical structure 160. The layer of third material 168 is over layer of second material 164. The third material 168 has the second doping polarity. The layer third material 168 conforms to the shape of the semispherical structure 160. A collector contact 176 is connected to the semispherical structure 160, a base contact 174 is connected to the layer of second material 164, and an emitter contact 172 is connected to the layer of third material 168.

An extension of the second material 164 is positioned within the substrate 100 and has an upper surface co-planar with the planar surface. The semispherical structure 160, the layer of second material 164, and the layer of third material 168 form an approximately half-sphere bump on the planar surface of the substrate 100. The insulating layer 162 is on the planar surface of the substrate 100. The insulating layer 162 is positioned only in regions where the semispherical structure 160 is absent. The collector contact 176 extends through the insulating layer 162. The layer of second material 164 directly contacts the semispherical structure 160 and the layer of third material 168 directly contacts the layer of second material 164 over the region of the semispherical structure 160.

Figure 19:
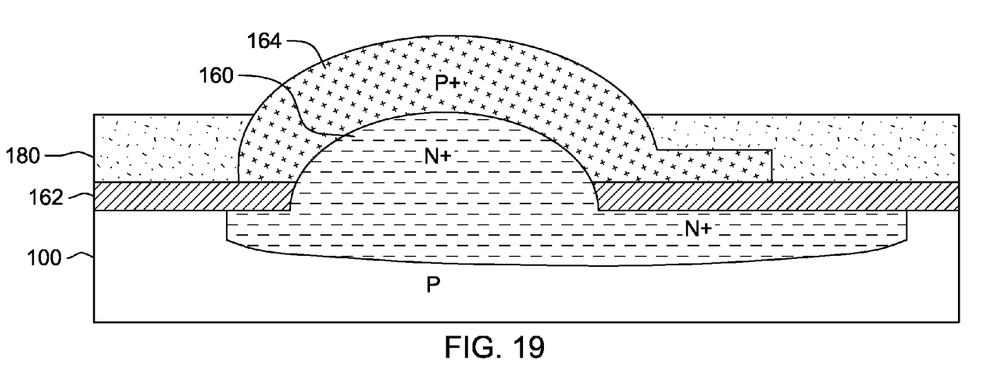
FIG. 19 is a cross-sectional schematic diagram of an integrated circuit bipolar transistor structure according to embodiments herein.

In alternative embodiments shown in FIGS. 18-23, various different structures can be formed. For example, in FIG. 18, a thick dielectric layer 180 is grown over the structure shown in FIG. 14. In FIG. 19, the thick dielectric layer 180 is removed that to a predetermined depth. Then the remaining processing shown in FIGS. 15-17 is completed to create a bipolar transistor and has greater isolation properties.

Figure 20:
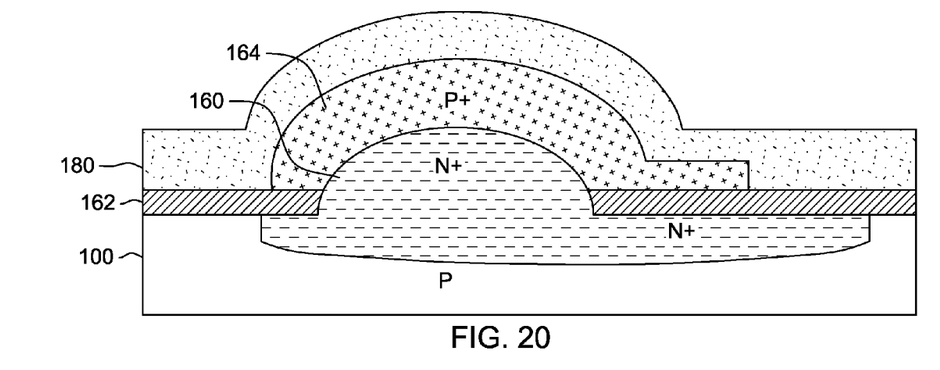
FIG. 20 is a cross-sectional schematic diagram of an integrated circuit bipolar transistor structure according to embodiments herein.
Figure 21:
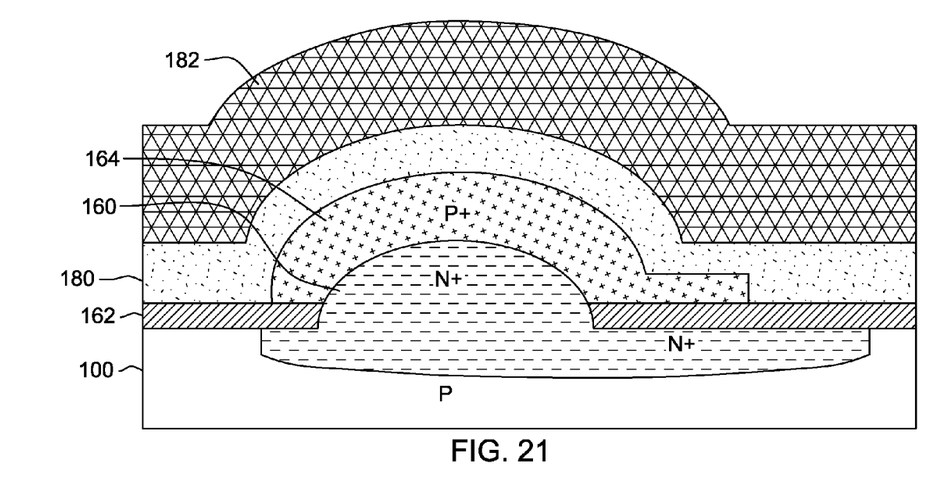
FIG. 21 is a cross-sectional schematic diagram of an integrated circuit bipolar transistor structure according to embodiments herein.
Figure 22:
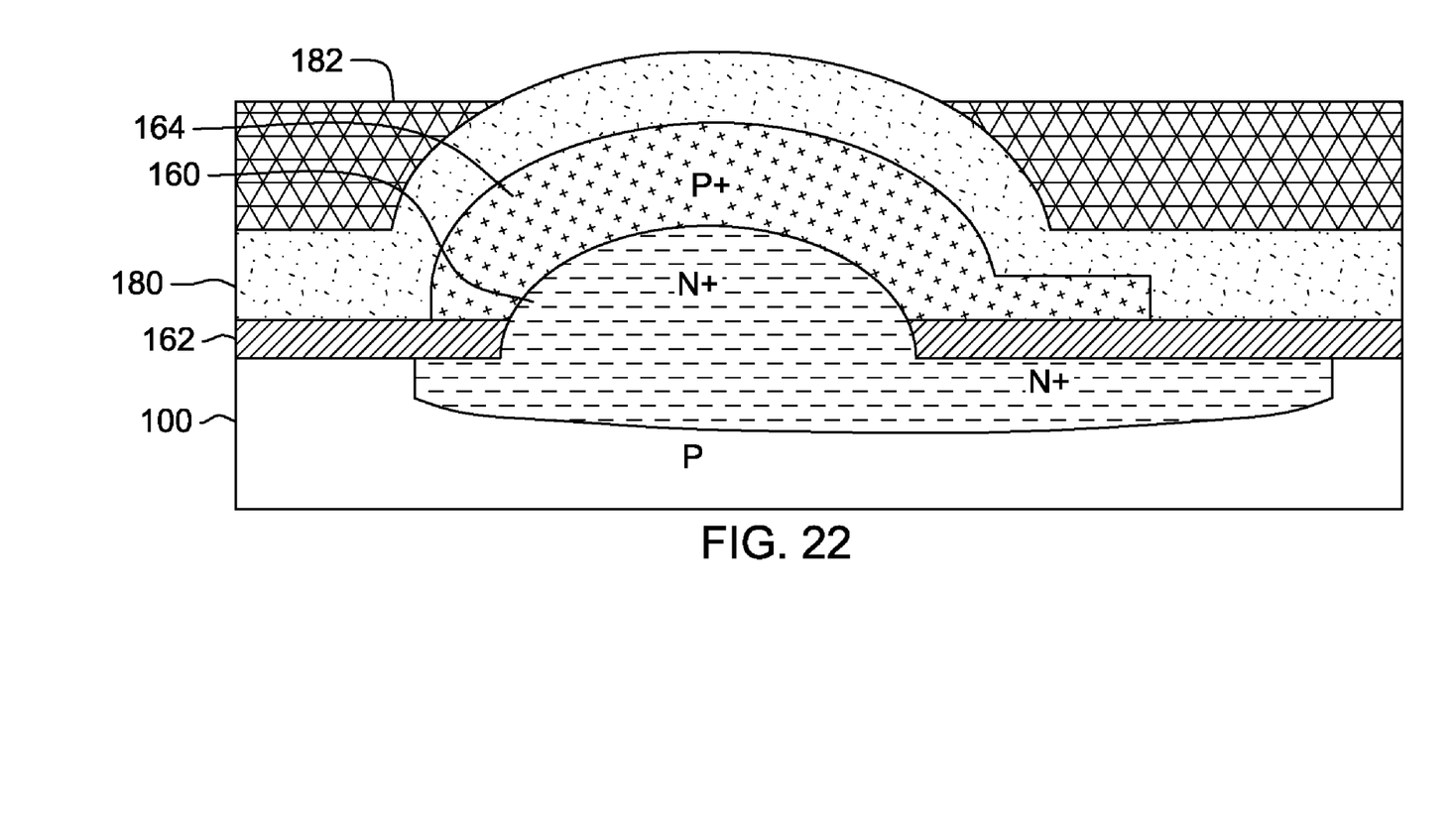
FIG. 22 is a cross-sectional schematic diagram of an integrated circuit bipolar transistor structure according to embodiments herein.

Also, as shown in FIG. 20, a thinner version of the same dielectric layer 180 can be formed and, as shown in FIG. 21, a spin-on material 182 (a photoresist, ARC, spin-on-glass, etc.) can be deposited. Then, the structure can be processed to expose the insulator 180 (as shown in FIG. 22). [deleted FIG. 23 and text] Then the remaining processing shown in FIGS. 15-17 is completed to create a bipolar transistor and has greater isolation properties.

Figure 23:
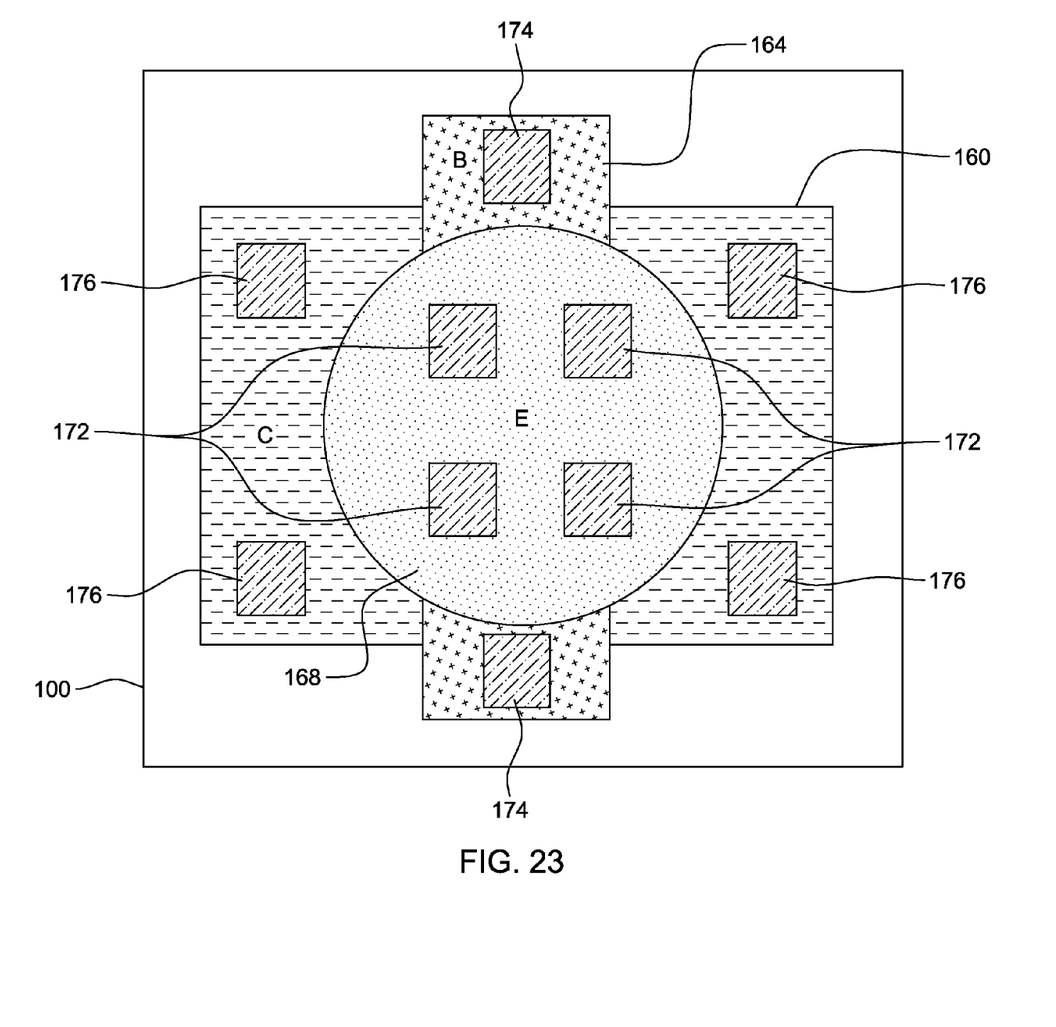
FIG. 23 is a top-view schematic diagram of an integrated circuit bipolar transistor structure according to embodiments herein.

FIG. 23 provides a top-view schematic illustration of the bipolar transistor (with the dielectrics not shown). Therefore, FIG. 23 illustrates the collector contacts 176 connected to the semispherical structure 160, the base contacts 174 connected to the layer of second material 164, and emitter contacts 172 connected to the layer of third material 168. As shown in FIG. 23, the structure has a circular, symmetric design which eliminates end effects.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products has a display, a keyboard or other input device, and a central processor.

The terminology used herein is for the purpose of describing particular embodiments only and is not intended to be limiting of the embodiments herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiment was chosen and described in order to best explain the principles of the embodiments herein and the practical application, and to enable others of ordinary skill in the art to understand the embodiments herein for various embodiments with various modifications as are suited to the particular use contemplated.

What is claimed is:

1. An integrated circuit structure comprising:
    a substrate comprising a first material having a first doping polarity, said substrate having a planar surface and at least one semispherical structure extending from said planar surface, said semispherical structure comprising said first material;
    a layer of second material over said semispherical structure, said second material comprising a second doping polarity opposite said first doping polarity, said layer of second material conforming to the shape of said semispherical structure;
    a first electrical contact connected to said substrate; and
    a second electrical contact connected to said layer of second material.

2. The integrated circuit structure according to claim 1, a portion of said layer of said second material being positioned within said substrate and having an upper surface co-planar with said planar surface.

3. The integrated circuit structure according to claim 1, a portion of said layer of said second material being positioned directly on said planar surface of said substrate.

4. The integrated circuit structure according to claim 1, further comprising an intrinsic layer positioned between said first material and said layer of second material, said intrinsic layer conforming to said shape of said semispherical structure.

5. The integrated circuit structure according to claim 4, a portion of said intrinsic layer being positioned within said substrate and being separated from said first material by said layer of second material.

6. The integrated circuit structure according to claim 4, a first portion of said intrinsic layer being positioned directly on said planar surface of said substrate, and a first portion of said layer of second material being positioned directly on said first portion of said intrinsic layer.

7. A bipolar transistor comprising:
    a substrate comprising a first material having a first doping polarity, said substrate having a planar surface;
    at least one semispherical structure extending from said planar surface, said semispherical structure comprising a second material having a second doping polarity opposite said first doping polarity;
    a layer of second material over said semispherical structure, said second material comprising said first doping polarity, said layer of second material conforming to the shape of said semispherical structure;
    a layer of third material over layer of second material, said third material comprising said second doping polarity, said layer third material conforming to the shape of said semispherical structure;
    a collector contact connected to said semispherical structure through said substrate;
    a base contact connected to said layer of second material; and
    an emitter contact connected to said layer of third material.

8. The bipolar transistor according to claim 7, further comprising an extension of said second material positioned one of within and on top of said substrate and having an upper surface co-planar with said planar surface.

9. The bipolar transistor according to claim 7, said semispherical structure, said layer of second material, and said layer of third material forming an approximately half-sphere bump on said planar surface of said substrate.

10. The bipolar transistor according to claim 7, further comprising an insulating layer on said planar surface of said substrate, said insulating layer being positioned only in regions where said semispherical structure is absent.

11. The bipolar transistor according to claim 10, said collector contact extending through said insulating layer.

12. The bipolar transistor according to claim 7, said layer of second material directly contacting said semispherical structure and said layer of third material directly contacting said layer of second material over the region of said semispherical structure.

13. A method of forming an integrated circuit structure, said method comprising:
    providing a substrate comprising a first material having a first doping polarity, said substrate having a planar surface;
    patterning at least one semispherical structure extending from said planar surface, said semispherical structure comprising said first material;
    forming a layer of second material over said semispherical structure, said second material comprising a second doping polarity opposite said first doping polarity, said layer of second material conforming to the shape of said semispherical structure;
    forming a first electrical contact connected to said substrate; and
    forming a second electrical contact connected to said layer of second material.

14. The method according to claim 13, said forming of said layer of second material comprising implanting ions corresponding to said second doping polarity.

15. The method according to claim 13, said forming of said layer of second material comprising depositing said layer of second material over said substrate and said semispherical structure.

16. The method according to claim 13, further comprising forming an intrinsic layer before forming said layer of second material, said intrinsic layer conforming to said shape of said semispherical structure.

17. The method according to claim 16, said forming of said intrinsic layer comprising implanting impurities into said substrate in a manner that leaves an undoped region of said substrate between said first material and said second material.

18. The method according to claim 16, said forming of said intrinsic layer comprising depositing an undoped layer on said semispherical structure before depositing said layer of second material.

19. A method of forming a bipolar transistor, said method comprising:

providing a substrate comprising a first material having a first doping polarity, said substrate having a planar surface;

patterning at least one semispherical structure extending from said planar surface, said semispherical structure comprising a second material having a second doping polarity opposite said first doping polarity;

forming a layer of second material over said semispherical structure, said second material comprising said first doping polarity, said layer of second material conforming to the shape of said semispherical structure;

forming a layer of third material over said layer of second material, said third material comprising said second doping polarity, said layer third material conforming to the shape of said semispherical structure;

forming a collector contact connected to said semispherical structure through said substrate;

forming a base contact connected to said layer of second material; and forming an emitter contact connected to said layer of third material.

20. The method according to claim 19, said patterning of said semispherical structure comprising forming a bump of said semispherical structure on said substrate and implanting second doping polarity ions into said semispherical structure and into a portion of said substrate adjacent said semispherical structure.

21. The method according to claim 19, said semispherical structure, said layer of second material, and said layer of third material forming an approximately half-sphere bump on said planar surface of said substrate.

22. The method according to claim 19, further comprising forming an insulating layer on said planar surface of said substrate, said insulating layer being positioned only in regions where said semispherical structure is absent.

23. The method according to claim 22, said collector contact being formed to extend through said insulating layer.

24. The method according to claim 19, said forming of said layer of second material causing said layer of second material to directly contact said semispherical structure, and said forming of said layer of third material causing said layer of third material to directly contact said layer of second material over the region of said semispherical structure.

* * * * *